United States Patent

Shoki et al.

Patent Number: 5,848,120
Date of Patent: Dec. 8, 1998

[54] X-RAY MASK BLANK, X-RAY MASK AND PATTERN TRANSFER METHOD

[75] Inventors: Tsutomu Shoki, Hachioji; Takamitsu Kawahara, Kawasaki, both of Japan

[73] Assignee: Hoya Corporation, Japan

[21] Appl. No.: 923,183

[22] Filed: Sep. 4, 1997

[30] Foreign Application Priority Data

Sep. 6, 1996 [JP] Japan ................................. 8-257500

[51] Int. Cl.$^6$ ........................................................ G03F 1/16
[52] U.S. Cl. ................................................ 378/35; 378/34
[58] Field of Search ........................... 378/34, 35; 430/5

[56] References Cited

U.S. PATENT DOCUMENTS 5,291,536  3/1994  Itoh et al. ................................ 378/34
5,607,733  3/1997  Fukuda et al. .......................... 427/585

FOREIGN PATENT DOCUMENTS 53-20767  2/1978  Japan .

OTHER PUBLICATIONS

English abstract: Japanese Published Application No. 53–20767.

*Primary Examiner*—David P. Porta
*Attorney, Agent, or Firm*—Edward D. Manzo; Mark J. Murphy

[57] ABSTRACT

There is provided an X-ray mask blank from which an X-ray mask having a remarkably small positional deformation even at a large window size of 50 mm square and a remarkably positional precision can be manufactured. The X-mask blank has an X-ray transparent film on a substrate and an X-ray absorber film on the X-ray transparent film. A product of Young modulus and film thickness of the X-ray transparent film is $6\times10^8$ to $3\times10^9$ dyn/cm.

11 Claims, 2 Drawing Sheets

X-RAY MASK BLANK, X-RAY MASK AND PATTERN TRANSFER METHOD

REFERENCE TO RELATED APPLICATION

This application claims the priority right under 35 U.S.C. 119, of Japanese Patent Application No. Hei 08-257500 filed on Sept. 9, 1996, the entire disclosure of which is incorporated herein by reference.

BACKGROUND OF THE INVENTION

1. Field of the Invention

The present invention relates to an X-ray mask blank, an X-ray mask and the like for use in X-ray lithography, and in particular to an X-ray mask blank, an X-ray mask and the like having an X-ray transparent film with a controlled Young modulus and film thickness influencing a pattern positional precision.

2. Description of the Related Art

In the semiconductor industry, as a technique for forming an integrated circuit of a fine pattern on a silicon substrate or the like, a photolithography method has been heretofore used in which the fine pattern is transferred using a visible light or an ultraviolet as an electromagnetic wave for exposure.

Recently, however, together with the progress of the semiconductor technique, the high integration of a super-LSI or another semiconductor device has been remarkably advanced. There is now a demand for a high-precision fine pattern transfer technique exceeding the limitations of the transfer technique by means of visible or ultraviolet lights heretofore used in the photolithography method.

To realize the fine pattern transfer, an X-ray lithography method using X-rays shorter in wavelength than visible or ultraviolet lights has been developed.

A structure of an X-ray mask for use in the X-ray lithography is shown in FIG. 1.

As shown in FIG. 1, an X-ray mask 1 consists of an X-ray transparent film or membrane 12 for transmitting X-rays and an X-ray absorber pattern 13a for absorbing X-rays, which are both supported on a support substrate or frame 11a of silicon.

A structure of an X-ray mask blank is shown in FIG. 2. An X-ray mask blank 2 consists of the X-ray transparent film 12 formed on a silicon substrate 11 and an X-ray absorber film 13.

For the X-ray transparent film, silicon nitride, silicon carbide, diamond or the like is usually used. For the X-ray absorber film, an amorphous material including Ta having a superior resistance to X-ray irradiation is often used.

The X-ray mask 1 is manufactured from the X-ray mask blank 2, for example, by the following method.

A resist film having a desired resist pattern formed thereon is disposed on the X-ray mask blank 2, and an X-ray absorber pattern is formed by dry etching using the resist pattern as a mask. Subsequently, a central regional film positioned in a window area or rear side recess is removed from the X-ray transparent film formed on the rear side of the X-ray absorber pattern, by reactive ion etching (RIE) using etching gas of $CF_4$. By using the remaining film as a mask, the rear side of the silicon substrate is etched or processed with an etching liquid consisting of a mixture liquid of hydrofluoric acid and nitric acid, to obtain the X-ray mask 1.

In this case, for the resist pattern, an electronic beam (EB) resist is usually used, and the pattern forming or exposure is carried out in an EB drawing method.

Here, the X-ray transparent film is required to have a high permeability to X-ray, a high Young modulus, a moderate tensile stress, a resistance to X-ray irradiation, a high permeability in a visible region and other properties.

These properties are described below.

The high permeability to X-ray is required at the time of exposure. The higher the permeability is, the shorter the period of time necessary for exposure becomes, and a throughput is effectively increased.

The Young modulus influences a film strength and an absorber pattern deformation. The higher the Young modulus is, the higher the film strength becomes, and a positional deformation can be effectively regulated.

The moderate tensile stress is necessary for making the X-ray transparent film self-supporting.

With the resistance to X-ray irradiation, the X-ray transparent film is prevented from being damaged by the X-ray irradiation at the time of exposure.

Regarding the permeability in the visible region, after the X-ray mask is attached to an X-ray stepper, the X-ray mask is aligned with a wafer using an alignment luminous source of the visible region. To realize a high precision alignment, a high permeability to the alignment luminous source is necessary. A desired value of the permeability depends on an alignment method and is not specified, but usually is about 60 to 80%.

To satisfy the aforementioned requirements, various materials and manufacture processes have been researched, and silicon nitride, silicon carbide, or diamond have been used as the X-ray transparent film. The film thickness is 1 to 2 $\mu$m, which is determined according to the conditions of optical transmissivity required for alignment. When the film thickness is increased, the optical transmissivity is monotonously decreased. Therefore, the 1 to 2 $\mu$m thick X-ray transparent film used is adequate.

Recently, accompanying the progress of photolithography technique, the time to introduce the X-ray lithography is delayed. It is expected at present to introduce the X-ray lithography from the generation of 1 Gbit-DRAM (design rule: 0.18 $\mu$m). Even if the X-ray lithography is introduced from the generation of 1 G, it can be used over a plurality of generations of 4 G, 16 G, or up to 64 G.

Supposing that the X-ray lithography is used at 64 G, the positional precision required of the X-ray mask is much stricter, and a high positional precision of 10 nm becomes necessary. Further, chip size will be increased every generation, and a window size of 50 mm square or more will be necessary at 64 G. Also at 1 Gbit-DRAM, by increasing the window size to 50 mm square or more relative to a chip size of 15×30 mm, a large number of chips can be taken per a piece of mask, and the throughput can be effectively improved. Therefore, the realization of the X-ray mask having a high positional precision at a window size of 50 mm square or more is necessary.

However, the 1 to 2 $\mu$m thick X-ray transparent film heretofore used is examined in detail in view of alignment precision, but the window size of 20 to 30 mm square is also evaluated. There is little dispute about the X-ray transparent film in respect of the film strength and positional precision at a large-sized window having an area of 1000 mm² or more.

The X-ray transparent film having a thickness of 1 to 2 $\mu$m has a remarkable decrease in film strength and a remarkable increase in positional deformation at a 50 mm square window. The inventors have confirmed that the 1 to 2 $\mu$m thick X-ray transparent film is difficult to be practically used.

The film strength and positional deformation of the X-ray transparent film is strongly influenced by not only the film thickness but the Young modulus thereof. The Young modulus, however, can be controlled to some degree with the material or manufacture process, but cannot be largely improved due to its limitations. Further, the Young modulus varies with the material or the manufacture process. Even the X-ray transparent films having the same film thickness are different in film strength from one another. A stable positional precision cannot be disadvantageously obtained.

On the other hand, when the film thickness of the X-ray transparent film is increased, a decrease in both optical transmissivity and X-ray permeability is expected. However, the required level of optical transmissivity is lowered because of the recent progress of alignment technique. A high-precision alignment is possible even at the optical transmissivity of, for example, 60% or less. Further, the luminance of the luminous source of X-ray is also progressively increased. The inventors et al. have confirmed that the increase of film thickness results in a decrease in X-ray permeability, but does not result in a remarkable decrease of exposure time.

SUMMARY OF THE INVENTION

An object of the invention is to provide an X-ray mask having a remarkably high positional precision and an X-ray mask blank suitable for manufacturing the X-ray mask.

As a result of earnest research conducted to attain the aforementioned object, the inventors have found that a product of Young modulus and film thickness of an X-ray transparent film needs to be $6 \times 10^8$ to $3 \times 10^9 dyn/cm$.

That is to say, a high positional precision and a high film strength are required of the X-ray mask. For example, in an X-ray mask for 1 Gbit-DRAM having a design rule pattern of 0.18 μm required for X-ray lithography, a pattern positional deformation needs to be regulated to 20 nm or less. Further, in an X-ray mask for 64 Gbit-DRAM, the pattern positional deformation needs to be regulated to 10 nm or less. Additionally, a window size of 50 mm square at maximum is used. It is known that the pattern positional deformation is significantly influenced by the film thickness and Young modulus of the X-ray transparent film. The inventors, however, have found that it is insufficient to simply increase the film thickness and the Young modulus, and it is important for minimizing the pattern positional deformation to control both the film thickness and the Young modulus considering from the optical transmissivity. Consequently, the inventors have found that the product of Young modulus and film thickness of the X-ray transparent film needs to be $6 \times 10^8$ to $3 \times 10^9 dyn/cm$.

It has been also found that silicon carbide can meet the aforementioned properties and is an indispensable material for manufacturing an X-ray mask from 1 bit-DRAM on.

Further, it has been found that the surface roughness of the X-ray transparent film strongly influences the edge roughness of an X-ray absorber film pattern, and that when the surface of the X-ray transparent film is rough, the edge roughness of the X-ray absorber film pattern becomes so large that only an insufficient transfer precision can be obtained. It is then found that by smoothing the surface of the X-ray transparent film and controlling the film thickness and Young modulus of the X-ray transparent film, an X-ray mask superior in reducing both the pattern positional deformation and the edge roughness can be obtained. Consequently, the present invention has been conceived.

Specifically, the present invention provides an X-ray mask blank having an X-ray transparent film on a substrate and an X-ray absorber film on the X-ray transparent film, in which a product of Young modulus and film thickness of the X-ray transparent film is $6 \times 10^8$ to $3.0 \times 10^9 dyn/cm$.

The X-ray mask blank according to the present invention has a constitution that the film thickness of the X-ray transparent film exceeds 2 μm, the X-ray transparent film comprises of silicon carbide, the X-ray transparent film has a surface processed with a smoothing process, the X-ray transparent film has a smooth surface having a surface roughness or center line average roughness Ra of 2.0 nm or less, the X-ray absorber film is constituted of a material mainly consisting of Ta, the X-ray absorber film comprises a material including Ta and B, or the X-ray absorber film has an amorphous structure.

The present invention further provides an X-ray mask manufactured using the aforementioned X-ray mask blank of the present invention.

Also in the X-ray mask of the present invention, a window area is 1000 $mm^2$ or more.

The present invention also provides a pattern transfer method for transferring a pattern on a transferred substrate using the aforementioned X-ray mask of the present invention.

Since the product of Young modulus and film thickness of the X-ray transparent film is $6 \times 10^8$ to $3 \times 10^9 dyn/cm$, the present invention can provide an X-ray mask having a remarkably small positional deformation even at a large widow size of 50 mm square and a remarkably high positional precision.

The present invention is described in detail below.

First, the X-ray mask blank of the present invention is described.

In the X-ray mask blank of the present invention, the product of Young modulus and film thickness of the X-ray transparent film is $6 \times 10^8$ to $3 \times 10^9 dyn/cm$.

If the product of Young modulus and film thickness of the X-ray transparent film is $6 \times 10^8$ dyn/cm or less, a sufficient film strength cannot be obtained, and a required positional precision cannot be provided. On the other hand, if the product of Young modulus and film thickness of the X-ray transparent film exceeds $3 \times 10^9 dyn/cm$, the silicon substrate is largely deformed and a highly smoothened mask substrate cannot be obtained.

Therefore, the product of Young modulus and film thickness of the X-ray transparent film is preferably $8 \times 10^8$ to $2.4 \times 10^9 dyn/cm$, and more preferably $8 \times 10^8$ to $1.6 \times 10^9 dyn/cm$.

The film thickness of the X-ray transparent film is preferably about 1.5 to 6 μm in view of the optical transmissivity, and more preferably about 2 to 4 μm in view of the film strength, the positional precision, the deformation of the silicon substrate and the like. The present invention can provide a thicker X-ray transparent film than the heretofore used 1 to 2 μm thick X-ray transparent film.

Also, the Young modulus of the X-ray transparent film is preferably 380 GPa or more in view of the film strength.

The X-ray transparent film having the aforementioned properties can be manufactured by controlling film forming conditions or the like.

The X-ray transparent film is not especially specified as long as it has the aforementioned properties according to the present invention. For example, a silicon carbide (SiC), silicon nitride (SiN), or diamond thin film is available.

Especially, silicon carbide is preferable in that the aforementioned properties of the present invention can be easily satisfied and a film highly resistant to X-ray irradiation can be formed.

In the present invention, the surface of the X-ray transparent film preferably undergoes a smoothing process.

The X-ray transparent film preferably has a smoothened surface, because when the surface roughness of the surface forming the X-ray absorber film is low, the edge roughness of a fine pattern is decreased.

Specifically, the surface roughness or center line average roughness Ra of the surface of the X-ray transparent film is preferably smoothened or decreased to 2.0 nm or less, more preferably 1.5 nm or less, and most preferably 1.2 nm or less. With the smoothing process, an X-ray absorber pattern having a small edge roughness can be obtained.

Further, the surface of the X-ray transparent film can be smoothened, for example, by mechanical polishing, etch-back process or another smoothing process.

In the present invention, the X-ray absorber film is preferably comprised of material mainly consisting of Ta in view of the X-ray irradiation resistance.

Also, the X-ray absorber material mainly consisting of Ta preferably includes at least B additionally. This is because the X-ray absorber film including Ta and B has a small internal stress, a high purity excluding impurities, a high X-ray absorbency and other advantages. The internal stress can be easily controlled by controlling the sputtering gas pressure during forming films.

The X-ray absorber material mainly consisting of Ta preferably has an amorphous structure or a crystallite structure. If the material has a columnar crystal structure, the fine processing of a submicron order is difficult, the internal stress is increased, and the X-ray mask deforms.

For the substrate for use in the present invention, a silicon wafer substrate or another known substrate is available.

In the X-ray mask blank of the present invention, layers or films other than the X-ray transparent film and the X-ray absorber film can be provided, as required.

For example, between the X-ray transparent film and the X-ray absorber film can be interposed, for example, an etching stop layer, an adhesion layer, a reflection preventive layer, a conductive layer or the like. Also, on the X-ray absorber film, a mask layer, a protective layer, a conductive layer or the like can be provided.

The X-ray mask of the present invention is manufactured using the aforementioned X-ray mask blank of the present invention.

Here, a heretofore known X-ray mask manufacture process is applied for manufacturing the X-ray mask blank.

The present invention can provide an X-ray mask in which the product of Young modulus and film thickness of the X-ray transparent film is $6 \times 10^8$ to $3.0 \times 10^9$ dyn/cm. The X-ray mask has a small positional deformation even at a large window size of 50 mm square, and a remarkably high positional precision.

In the pattern transfer method of the present invention, a pattern is transferred on a transferred substrate using the aforementioned X-ray mask of the present invention.

The X-ray mask used in the aforementioned pattern transfer method provides a high positional precision of 10 nm required for 64 Gbit-DRAM and a large window size of 50 mm square or more. Therefore, a mass production of 64 Gbit-DRAM is possible. Also, even in case of 1 Gbit-DRAM, a large number of chips can be taken from a piece of mask, and the throughput can be effectively improved.

DESCRIPTION OF THE PREFERRED EMBODIMENTS

Embodiments of the present invention are now described in detail.

EXAMPLE 1

Manufacture of X-ray Mask Blank

Figure 3:
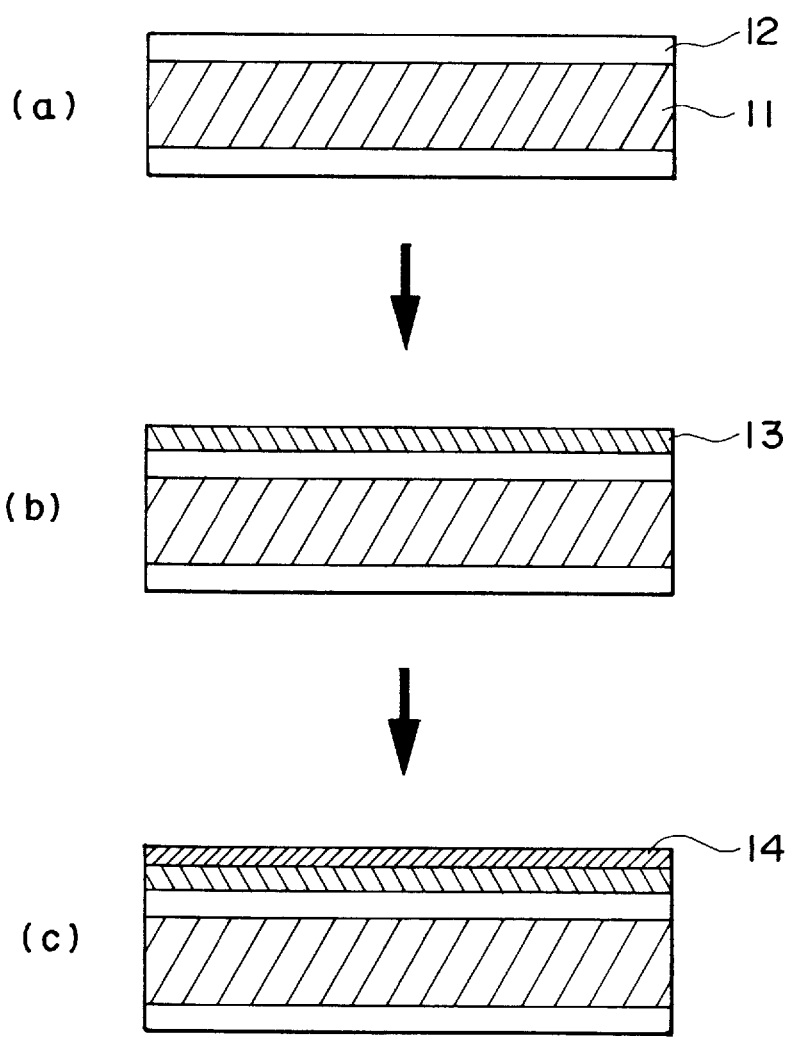
FIG. 3 is a cross-sectional view showing a manufacture process of an X-ray mask blank embodying the present invention.

FIG. 3 is a cross-sectional view showing the manufacture process of an X-ray mask blank according to an embodiment of the present invention.

First, as shown in FIG. 3(a), a 3 μm thick silicon carbide film was formed using dichlorosilane and acetylene in a CVD method as an X-ray transparent film 12 on both surfaces of a silicon substrate 11 having a diameter of 4 inches, a thickness of 2 mm and a crystal orientation (100).

The surface of the silicon carbide film was smoothened by mechanical polishing, so that the surface roughness Ra was 1 nm or less.

Further, the Young modulus (E/(1−ν)) of the silicon carbide film was 450 GPa, and the product of Young modulus and film thickness was $1.35 \times 10^9$ dyn/cm. The Young modulus was measured in a bulge method.

Subsequently, as shown in FIG. 3(b), on the X-ray transparent film 12, an X-ray absorber film 13 consisting of tantalum and boron was formed in a 0.5 μm thick film in an RF magnetron sputtering method.

Sputtering was carried out by targeting a sintered body including tantalum and boron at an atomic ratio (Ta/B) of 8/2, on the conditions that Ar gas was used as sputtering gas, the RF power density was 6.5 W/cm², and the sputtering gas pressure was 1.0 Pa.

Subsequently, the substrate was annealed in a nitrogen atmosphere at 250° C. for two hours, and the X-ray absorber film 13 having a low stress of 10 MPa or less was obtained.

Subsequently, as shown in FIG. 3 (c), on the X-ray absorber film 13, a 0.05 μm thick film including chromium and carbon was formed as an etching mask layer 14 in the RF magnetron sputtering method. As a result, the etching mask layer 14 having a low stress of 100 MPa or less was obtained.

Sputtering was carried out by targeting Cr on the conditions that Ar gas mixed with 7% of methane gas was used as sputtering gas, the RF power density was 6.5 W/cm², and the sputtering gas pressure was 1.2 Pa.

Manufacture and Evaluation of X-ray Mask

Figure 1:
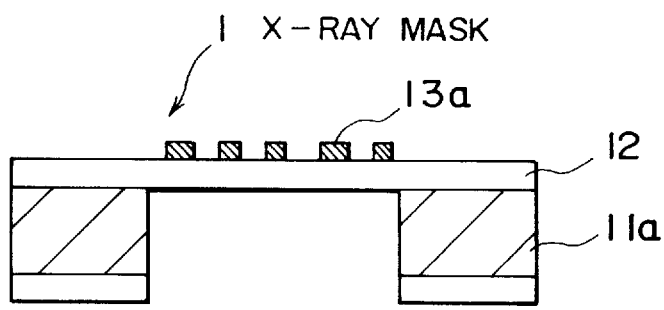
FIG. 1 cross-sectional view showing a structure of an X-ray mask.

The X-ray mask (FIG. 1) having a 50 mm square window was manufactured using the X-ray mask blank obtained in Example 1. The positional deformation was measured with a coordinate measurement apparatus, and was 22 nm or less, which is required of the X-ray mask. It was confirmed that a high positional precision can be achieved, and the film strength has no problem for practical use.

EXAMPLE 2

Manufacture of X-ray Mask Blank

In Example 2, the manufacture process of Example 1 was used.

First, a 5 μm thick silicon carbide film was formed using dichlorosilane and acetylene in the CVD method as an X-ray transparent film on both surfaces of a silicon substrate having a diameter of 4 inches, a thickness of 2 mm and a crystal orientation (100).

The surface of the silicon carbide film was smoothened by mechanical polishing, so that the surface roughness Ra was 1 nm or less.

Further, the Young modulus (E/(1−v)) of the silicon carbide film was 480 GPa, and the product of Young modulus and film thickness was $2.4 \times 10^9$ dyn/cm. The Young modulus was measured in the bulge method.

Subsequently, on the X-ray transparent film, an X-ray absorber film consisting of tantalum and boron was formed in a 0.5 μm thick film in the RF magnetron sputtering method.

Sputtering was carried out by targeting a sintered body including tantalum and boron at an atomic ratio (Ta/B) of 8/2, on the conditions that Xe gas was used as sputtering gas, the RF power density was 6.5 W/cm$^2$, and the sputtering gas pressure was 0.35 Pa.

Subsequently, the substrate was annealed in a nitrogen atmosphere at 250° C. for two hours, and the X-ray absorber film having a low stress of 10 MPa or less was obtained.

Subsequently, on the X-ray absorber film, a 0.05 μm thick film including chromium and carbon was formed as an etching mask layer in the RF magnetron sputtering method. As a result, the etching mask layer having a low stress of 100 MPa or less was obtained.

Sputtering was carried out by targeting Cr on the conditions that Ar gas mixed with 7% of methane gas was used as sputtering gas, the RF power density was 6.5 W/cm$^2$ and the sputtering gas pressure was 1.2 Pa.

Manufacture and Evaluation of X-ray Mask

The X-ray mask (FIG. 2) having a 50 mm square window was manufactured using the X-ray mask blank obtained in Example 2. The positional deformation was measured with the coordinate measurement apparatus, and was 22 nm or less, which is required of the X-ray mask. It was confirmed that a high positional precision can be achieved, and the film strength has no problem for practical use.

Comparative Example 1

Manufacture of X-ray Mask Blank

In Comparative Example 1, the manufacture process of Example 1 was used.

First, a 1 μm thick silicon carbide film was formed using dichlorosilane and acetylene in the CVD method as an X-ray transparent film on both surfaces of a silicon substrate having a diameter of 4 inches, a thickness of 2 mm and a crystal orientation (100).

The surface of the silicon carbide film was smoothened by mechanical polishing, so that the surface roughness Ra was 1 nm or less.

Further, the Young modulus (E/ (1−v)) of the silicon carbide film was 430 GPa, and the product of Young modulus and film thickness was $4.3 \times 10^8$ dyn/cm. The Young modulus was measured in the bulge method.

Subsequently, on the X-ray transparent film, an X-ray absorber film consisting of tantalum and boron was formed in a 0.5 μm thick film in the RF magnetron sputtering method.

Sputtering was carried out by targeting a sintered body including tantalum and boron at an atomic ratio (Ta/B) of 8/2, on the conditions that Xe gas was used as sputtering gas, the RF power density was 6.5 W/cm$^2$, and the sputtering gas pressure was 0.35 Pa.

Subsequently, the substrate was annealed in a nitrogen atmosphere at 250° C. for two hours, and the X-ray absorber film having a low stress of 10 MPa or less was obtained.

Subsequently, on the X-ray absorber film, a 0.05 μm thick film including chromium and carbon was formed as an etching mask layer in the RF magnetron sputtering method.

As a result, the etching mask layer having a low stress of 1000 MPa or less was obtained.

Sputtering was carried out by targeting Cr on the conditions that Ar gas mixed with 7% of methane gas was used as sputtering gas, the RF power density was 6.5 W/cm$^2$ and the sputtering gas pressure was 1.2 Pa.

Manufacture and Evaluation of X-ray Mask

The X-ray mask (FIG. 2) having a 50 mm square window was manufactured using the X-ray mask blank obtained in Comparative Example 1. The positional deformation was measured at 40 nm with the coordinate measurement apparatus. Therefore, it was confirmed that a desired high positional precision cannot be achieved, the film strength is insufficient for practical use, and that the films easily ruptures after repeated use.

Comparative Example 2

Manufacture of X-ray Mask Blank

In Comparative Example 2, the manufacture process of Example 1 was used.

First, a 7 μm thick silicon carbide film was formed using dichlorosilane and acetylene in the CVD method as an X-ray transparent film on both surfaces of a silicon substrate having a diameter of 4 inches, a thickness of 2 mm and a crystal orientation (100).

The surface of the silicon carbide film was smoothened by mechanical polishing, so that the surface roughness Ra was 1 nm or less.

Further, the Young modulus (E/(1−v)) of the silicon carbide film was 500 GPa, and the product of Young modulus and film thickness was $3.5 \times 10^9$ dyn/cm. The Young modulus was measured in the bulge method.

Subsequently, on the X-ray transparent film, an X-ray absorber film consisting of tantalum and boron was formed in a 0.5 μm thick film in the RF magnetron sputtering method.

Sputtering was carried out by targeting a sintered body including tantalum and boron at an atomic ratio (Ta/B) of 8/2, on the conditions that Xe gas was used as sputtering gas, the RF power density was 6.5 W/cm$^2$, and the sputtering gas pressure was 0.35 Pa.

Subsequently, the substrate was annealed in a nitrogen atmosphere at 250° C. for two hours, and the X-ray absorber film having a low stress of 10 MPa or less was obtained.

Subsequently, on the X-ray absorber film, a 0.05 μm thick film including chromium and carbon was formed as an etching mask layer in the RF magnetron sputtering method. As a result, the etching mask layer having a low stress of 100 MPa or less was obtained.

Sputtering was carried out by targeting Cr on the conditions that Ar gas mixed with 7% of methane gas was used as sputtering gas, the RF power density was 6.5 W/cm$^2$ and the sputtering gas pressure was 1.2 Pa.

Manufacture and Evaluation of X-ray Mask

The X-ray mask (FIG. 2) having a 50 mm square window was manufactured using the X-ray mask blank obtained in Comparative Example 2. The positional deformation was measured with the coordinate measurement apparatus, and was 22 nm, which is required of the X-ray mask. It was confirmed that a high positional precision can be achieved, and the film strength has no problem for practical use. It was confirmed, however, that the visible light permeability is low, and a high precision alignment is impossible.

The present invention has been described with reference to preferred embodiments, but the present invention is not necessarily restricted to the embodiments.

In the examples, dichlorosilane and acetylene were used as reaction gas for forming the X-ray transparent film. If dichlorosilane is replaced by trichlorosilane, silane or the like and acetylene is replaced by propane or another hydrocarbon system gas, the resulting effect can be the same.

For the X-ray absorber film, the compound of tantalum and boron at the atomic ratio of Ta:B=8:2 can be replaced by a metal Ta, an amorphous material including Ta, tantalum boride having a composition except $Ta_4B$ or the like.

Figure 2:
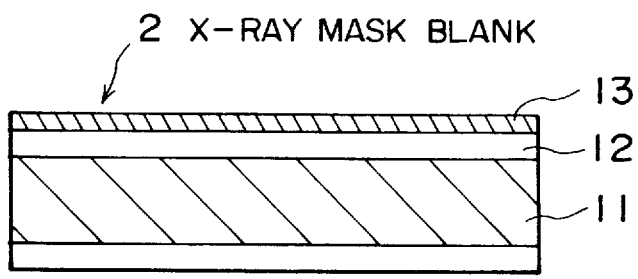
FIG. 2 is a cross-sectional view showing a structure of an X-ray mask blank.

Further, the structure of the X-ray mask blank is not restricted to the structure shown in FIG. 2. After the X-ray transparent film is formed, the silicon placed on the central part of the rear side can be etched or removed, and a membrane substrate can be used.

What is claimed is:

1. An X-ray mask blank comprising:
   (a) a substrate;
   (b) an X-ray transparent film formed on said substrate; and
   (c) an X-ray absorber film formed on said X-ray transparent film, wherein
   a product of Young modulus and film thickness of said X-ray transparent film is $6 \times 10^8$ to $3 \times 10^9$ dyn/cm.

2. The X-ray mask blank according to claim 1, wherein the film thickness of said X-ray transparent film exceeds 2 μm.

3. The X-ray mask blank according to claim 1, wherein said X-ray transparent film comprises silicon carbide.

4. The X-ray mask blank according to claim 3, wherein said X-ray transparent film has a surface with a smoothing process applied thereto.

5. The X-ray mask blank according to claim 4, wherein the surface of said X-ray transparent film has a smooth face with a surface roughness or center line average roughness Ra of 2.0 nm or less.

6. The X-ray mask blank according to claim 1, wherein said X-ray absorber film comprises a material mainly consisting of Ta.

7. The X-ray mask blank according to claim 6, wherein said X-ray absorber film comprises a material including Ta and B.

8. The X-ray mask blank according to claim 1, wherein said X-ray absorber film is a film having an amorphous structure.

9. An X-ray mask comprising:
   (a) a support frame;
   (b) an X-ray transparent film formed on said frame; and
   (c) an X-ray absorber pattern film formed on said X-ray transparent film,
   wherein a product of Young modulus and film thickness of said X-ray transparent film is $6 \times 10^8$ to $3 \times 10^9$ dyn/cm.

10. The X-ray mask according to claim 9, wherein a window area is 1000 $mm^2$ or more.

11. A pattern transfer method comprising the step of transferring a pattern formed on a mask to a receptor by X-ray irradiation, wherein said mask includes: (a) a support frame; (b) an X-ray transparent film formed on said frame; and (c) an X-ray absorber pattern film formed on said X-ray transparent film, wherein a product of Young modulus and film thickness of said X-ray transparent film is $6 \times 10^8$ to $3 \times 10^9$ dyn/cm.

* * * * *